US006776090B2

(12) United States Patent
Takenaka et al.

(10) Patent No.: US 6,776,090 B2
(45) Date of Patent: Aug. 17, 2004

(54) PRINTING PLATE, AND PRINTING METHOD USING THE SAME

(75) Inventors: Toshiaki Takenaka, Kyoto (JP); Toshikazu Kondo, Osaka (JP); Mitsunori Maeda, Osaka (JP); Hiroshi Tahara, Hyogo (JP); Shinji Nakamura, Osaka (JP); Yuichiro Sugita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 8 days.

(21) Appl. No.: 09/937,719

(22) PCT Filed: Jan. 31, 2001

(86) PCT No.: PCT/JP01/00638

§ 371 (c)(1),
(2), (4) Date: Jan. 3, 2002

(87) PCT Pub. No.: WO01/56793

PCT Pub. Date: Aug. 9, 2001

(65) Prior Publication Data

US 2002/0178942 A1 Dec. 5, 2002

(30) Foreign Application Priority Data

Feb. 1, 2000 (JP) ........................................ 2000-023688

(51) Int. Cl.[7] ............................. B41M 1/12; B41F 41/00
(52) U.S. Cl. ....................... 101/127; 101/123; 101/129; 101/425
(58) Field of Search ................................. 101/114, 123, 101/124, 127, 129, 128.1, 423, 425

(56) References Cited

U.S. PATENT DOCUMENTS 2,881,698 A * 4/1959 Graham ..................... 101/123
3,731,623 A * 5/1973 Bubley et al. .............. 101/123
5,044,306 A * 9/1991 Erdmann .................... 101/123
5,273,780 A * 12/1993 Borger et al. ............... 101/123
5,287,806 A * 2/1994 Nanzai ....................... 101/123
5,704,286 A * 1/1998 Takashima .................. 101/127
5,840,432 A * 11/1998 Hirai et al. ................. 428/570
5,953,986 A * 9/1999 Murakami .................. 101/123
6,186,063 B1 * 2/2001 D Prisco et al. ........... 101/123
6,272,984 B1 * 8/2001 Kato et al. .................. 101/129
6,352,334 B2 * 3/2002 Fukushima et al. .......... 347/33

FOREIGN PATENT DOCUMENTS

| JP | 61-270160 | * 11/1986 | |
| JP | 62-132643 | * 6/1987 | |
| JP | 62-292435 | * 12/1987 | |
| JP | 02-34395 | * 2/1990 | ............ 101/128.21 |
| JP | 6-32077 | 2/1994 | |
| JP | 6-251618 | 9/1994 | |
| JP | 6-268345 | 9/1994 | |
| JP | 7-106760 | 4/1995 | |
| JP | 10-193565 | 7/1998 | |
| JP | 11-121923 | 4/1999 | |

* cited by examiner

Primary Examiner—Stephen R. Funk
(74) Attorney, Agent, or Firm—McDermott, Will & Emery

(57) ABSTRACT

A circuit board with high quality is provided by preventing the falling of paste which comes around to the squeegee complementary angle side during the pattern printing or paste filling by the squeegeeing method. While lowering, the squeegee is passed through the inclined portion of a paste removing section (3) provided on a mask (2) before pattern printing or paste filling, whereby the paste on the non-printing side (complementary angle) of the squeegee can be removed; thus, a circuit board superior in quality is obtained.

20 Claims, 8 Drawing Sheets

(a) Paste removing member θ=15°

(b) Paste removing member θ=35°

(c) Paste removing member θ=45°

Accumulation of falling paste (d) Paste removing member θ=90°

Accumulation of falling paste

Gap due to a mask deformation

PRINTING PLATE, AND PRINTING METHOD USING THE SAME

TECHNICAL FIELD

The present invention relates to a plate for printing and a method of using it, which are employed in patterning of a paste, filling a paste in a through hole and the like to prepare two-sided or multilayered wiring boards for use in a variety of electronic equipment.

BACKGROUND ART

In recent years, as a reduction in size and an increase in assembly density are in progress in electronic equipment, an increasingly multilayered structure has been required of circuit boards not only in the industrial electronics area but also in the consumer electronics area. With such circuit boards, it has become absolutely necessary to develop a new inner via-hole joining method for connecting between the circuit patterns disposed on a plurality of layers and also a new and highly reliable structure. In this respect, a new technology is disclosed to realize a high density circuit board manufacturing method of new construction featuring an inner via-hole connection performed by the use of a conductive paste. (Refer to the Japanese Patent Application Unexamined Publication No. H6-268345.) A description is given to this circuit board manufacturing method in the following:

First, a conventional manufacturing method of two-sided circuit boards is described.

FIG. 8(a) to FIG. 8(f) show cross-sectional views of the steps constituting a conventional manufacturing method of two-sided circuit boards. FIG. 9 is a perspective view of a conventional plate framework with an opening provided and a mask attached thereto. FIG. 10 is a cross-sectional view of the foregoing conventional plate framework with an opening provided and a mask attached thereto. FIG. 11(a) to FIG. 11(g) show cross-sectional views of the paste filling steps performed according to a squeegeeing method.

In FIG. 8, the reference numeral 21 is a prereg sheet measuring 300 mm wide, 500 mm long and 150 $\mu$m thick and using a board material formed of a composite prepared by having a nonwoven fabric formed of all-aromatic polyamide fibers impregnated with a thermosetting epoxy resin. The reference alphanumeric characters 22a and 22b are mask films formed of a plastic film, respectively, measuring 300 mm wide and about 16 $\mu$m thick and having a Si-based mold release layer of less than 0.01 $\mu$m in thickness disposed on the surface thereof that is in contact with prereg sheet 21. Polyethyleneterephthalate is used as such, for example.

As the method for putting together prereg 21 and mask films 22a and 22b, disclosure is made about a method for continuously attaching by adhesion mask films 22a and 22b on prereg sheet 21 with the resin content thereof melted by the use of a laminating machine. (See the Japanese Patent Application Unexamined Publication No. H7-106766.) The reference numeral 23 is a through hole, which is filled with conductive paste 24 to connect electrically to metal foils 25a and 25b, each measuring 35 $\mu$m in thickness, formed of copper and the like and stuck onto both surfaces of prereg sheet 21, respectively.

The conventional manufacturing method of two-sided circuit boards comprises the steps of forming first through hole 23 on prereg sheet 21, on both surfaces of which mask films 22a and 22b are attached by adhesion, respectively, [FIG. 8(a)] at a predetermined position thereof by a laser beam machining method and the like as FIG. 8(b) shows, and then filling conductive paste 24 in through hole 23 as FIG. 8(c) shows. The method for filling conductive paste 24 comprises the steps of placing prereg sheet 21 having through hole 23 formed thereon on a stage of an ordinary printing machine (not shown in FIG. 8) and then filling conductive paste 24 in through hole 23 directly from the top of mask film 22a by shuttling two squeegees formed of urethane rubber and the like to and fro alternately. At this time, mask films 22a and 22b on prereg sheet 21 act as a print mask, respectively, and also serve as means for preventing the surface of prereg sheet 21 from getting contaminated.

A description is further given to the method for filling conductive paste 24 with reference to FIG. 9, FIG. 10 and FIG. 11(a) to FIG. 11(g). A squeegeeing method is used to fill conductive paste 24. However, since mask films 22a and 22b designed specifically for use with prereg sheet 21 are put in place, mask 2, which is formed of stainless steel, measuring about 3 mm in thickness and provided with an opening of an area of 250 mm by 450 mm larger than the effective paste filling area of prereg sheet 21, is mounted on plate framework 1 of a plate for printing 10 for paste filling as FIG. 9 and FIG. 10 show. A slanting area with a slanting angle about 15° provided in opening 4 of mask 2 in the squeegees forward moving direction (at the 450 mm side) for the whole purpose of facilitating the passage of the squeegee.

The process of filling conductive paste 24 comprises the steps of setting mask 2 on prereg sheet 21, which is attached by adhesion with mask films 22a and 22b on both surfaces thereof, respectively, formed with through hole 23 thereon and disposed on stage 6 of a printing machine (not shown in FIG. 11) as FIG. 11(a) shows, and lowering the position of only a moving forth squeegee 5a out of both moving forth squeegee 5a and moving back squeegee 5b, which are located above, made movable up and down and right and left, and can be applied with a pressing force, to a predetermined position on mask 2 and having moving forth squeegee 5a moved forward while keeping conductive paste 24 rolling with a pressing force applied thereto. Air is used as the source of a pressing force to be applied to squeegees.

As FIG. 11(b) shows, moving forth squeegee 5a passes the slanting area of mask 2 and reaches the surface of prereg sheet 21. Both moving forth squeegee 5a and moving back squeegee 5b are provided with the ability to move up and down freely according to the positions thereof while maintaining a pressing force to be applied thereto. Thereafter, as FIG. 11(c) shows, moving forth squeegee 5a stops at a predetermined position on mask 2 after travelling on prereg sheet 21 and passing again another slanting area of mask 2, moves upward and then let conductive paste 24 fall freely.

Next, as FIG. 11(d) shows, only moving back squeegee 5b is made to move downward to a predetermined position on mask 2. Then, as FIG. 11(e) to FIG. 11(g) show, by having moving back squeegee 5b moved over mask 2 and prereg sheet 21 in the same manner as moving forth squeegee 5a, the step of filling conductive paste 24 in through hole 23 is completed.

Then, as FIG. 8(d) shows, mask films 22a and 22b are peeled off from both surfaces of prereg sheet 21 and metal foils 25a and 25b formed of copper and the like are superimposed on both surfaces of prereg sheet 21, respectively, as FIG. 8(e) shows. By having a pressing force applied to the foregoing laminate while heat being applied thereto by means of a heat press, not only prereg sheet 21 is compressed in the thickness direction thereof (t2=about 100 μm) but also prereg sheet 21 is joined by adhesion with metal foils 25a and 25b as FIG. 8(f) shows. Meanwhile, metal foils 25a and 25b on the surfaces of prereg sheet 21 are connected electrically with each other via conductive paste 24 filled in through hole 23 formed in prereg sheet 21 at a predetermined position thereof. Then, circuit patterns (not shown in FIG. 8) are formed on metal foils 25a and 25b on the surfaces of prereg sheet 21 by selective etching, thus allowing a two-sided circuit board to be obtained.

However, according to the conventional method for filling a conductive paste as described in above, when the conductive paste is filled in by moving squeegees back and forth, the conductive paste is dropped freely by lifting a moving forth or a moving back squeegee. When this process is repeated to fill in the conductive paste, the squeegee descends on a predetermined position on a mask with some of the paste still remained on the squeegee, thereby allowing the conductive paste to extend to a non-printing surface side of the squeegee (i.e., a complementary angle side).

When the squeegee is moved forward to fill in the conductive paste with some of the conductive paste extended to the non-printing surface side of the squeegee (i.e., the complementary angle side), especially when a conductive paste of low viscosity or a dilatant conductive paste is used, the paste attached to the non-printing surface side of the squeegee (i.e., the complementary angle side) falls on the through hole of the prereg sheet during the movement of the squeegee due to gravity or low viscosity of the conductive paste, resulting in a problem of causing sometimes such an adverse effect on product quality as transferring part of the conductive paste to the mask film side when the mask film is peeled off from the prereg sheet.

SUMMARY OF THE INVENTION

In order to deal with the problem as described in above, a plate for printing and a printing-filling in method using the plate for printing of the present invention feature a removal of the conductive paste attached to the non-printing side (i.e., the complementary angle side) of a squeegee, thereby allowing circuit boards with excellent quality to be obtained.

PREFERRED MODE FOR CARRYING OUT THE INVENTION

A first aspect of the present invention is a paste removing member that is provided in a non-opening area located outside of the effective area for pattern printing or paste filling and at the side where the pattern printing or paste filling starts, thereby allowing a paste to be prevented from falling, and also a printing method in the first exemplary embodiment of the present invention features the use of a plate for printing, in which the paste removing member is split into a flat area and a slanting area, thereby allowing the paste elimination and the squeegee's motions such as descending, contacting and sliding to be performed smoothly.

A second aspect of the present invention is a plate for printing that is compatible with printing using a moving forth squeegee and printing using a moving back squeegee, and even when the plate for printing is used with low viscosity pastes such as a conductive paste containing metallic powder for use in paste applying printing to fill a paste in a through hole and the like, the paste extended to a non-printing surface side of a squeegee (i.e., a complementary angle side) does not fall on the through hole of a prereg sheet during the movement of the squeegee due to gravity or low viscosity of the paste, thereby eliminating the possibilities of affecting adversely on product quality caused by part of the paste transferred onto a mask film when the mask film is peeled off. In particular, the aforementioned benefit is multiplied when a dilatant paste, the viscosity of which is reduced upon suspending the process of mixing, or a Newtonian paste, which does not show any increase in viscosity, is used.

A third aspect of the present invention is in having the paste removing member placed on one of the surfaces of the plate for printing located in the squeegee's forward moving direction or integrated in one-piece construction with the plate for printing, thereby allowing an operation of attaching or detaching of the paste removing member to be no longer needed at the time of exchanging a mask and also allowing the plate for printing to be used as a general purpose plate for screen printing that requires a mask modification.

A fourth aspect of the present invention is in that a swinging motion of a squeegee is facilitated and further the squeegee is prevented from wearing.

A fifth aspect of the present invention is in that the entire paste on the non-printing side of a squeegee is allowed to be removed with stability.

Next, a description is given to some of the exemplary embodiments of the present invention with reference to drawings.

(First Exemplary Embodiment)

Figure 1:
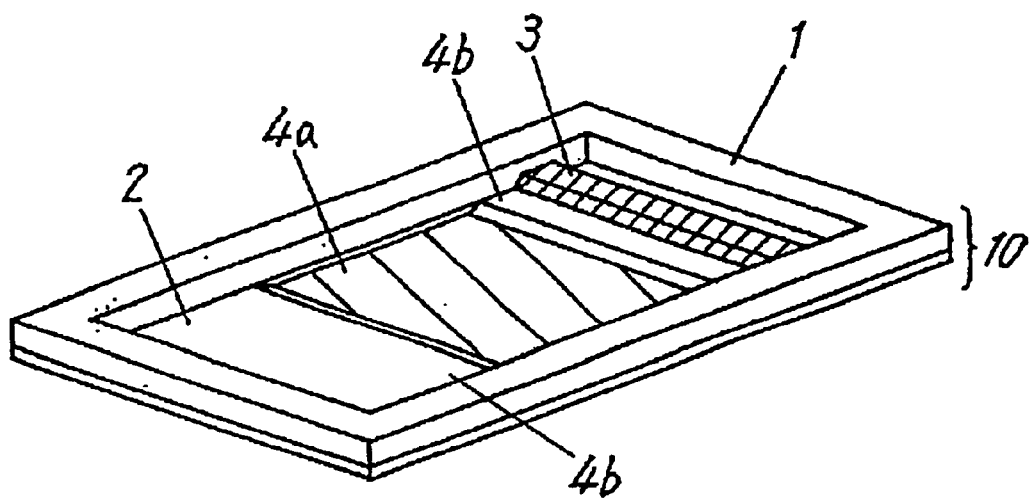
FIG. 1 is a perspective view of a first plate for printing of the present invention.
Figure 2:
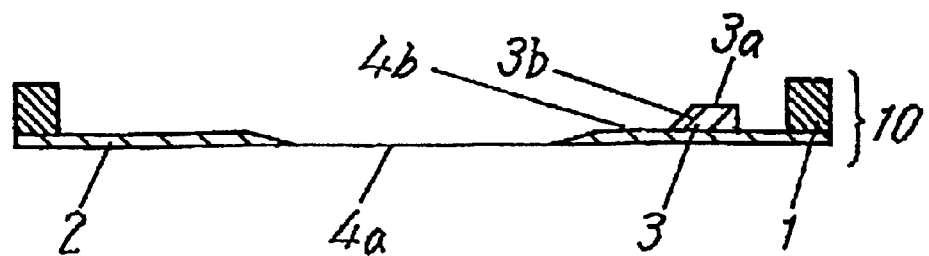
FIG. 2 is a cross-sectional view of the first plate for printing of the present invention.

The stepwise cross-sectional views of a manufacturing method of two-sided printed circuit boards according to the present invention are the same as the conventional manufacturing method described in above and, therefore, a detailed description thereof is omitted. Instead, a description is given to a method for filling a paste and a plate for paste filling. FIG. 1 is a perspective view of a first plate for printing of the present invention and FIG. 2 is a cross-sectional view of the first plate for printing of the present invention. FIG. 3(a) to FIG. 3(g) show cross-sectional views of the paste filling steps performed according to a squeegeeing method of the present invention and FIG. 4 shows cross-sectional views of a paste removing member for examining how the slanting angles of the paste removing member of the present invention affect the effectiveness thereof.

The same reference alphanumeric characters are given to the same constituents and components as used in describing the conventional technologies of above and a detailed description thereof is omitted here.

As FIG. 1 and FIG. 2 show, a first plate for printing of the present invention has an exclusively designed mask film disposed on prereg sheet 21 measuring 300 mm wide, 500 mm long and about 150 $\mu$m thick. Therefore, on plate framework 1 is mounted about 3 mm thick stainless steel mask 2 having opening 4a of 250 mm by 450 mm, which is larger than the effective paste filing area of prereg sheet 21, and also non-opening area 4b.

A slanting area with a slanting angle of about 15° is provided on opening 4a of mask 2 in the squeegee's forward moving direction (at the side of 450 mm) for the whole purpose of facilitating the passage of a squeegee. On non-opening area 4b of mask 2, there is provided stainless steel paste removing member 3, the surfaces of which realize a high degree of smoothness by buffing and the like and are formed of flat area 3a and slanting area 3b with a slanting angle of 35° The high degree of smoothness achieved on the surfaces of paste removing member 3 is intended for preventing the wear of the squeegee from occurring and is expected to be almost at the same level as that of the surfaces of mask 2 in the present exemplary embodiment.

The length of slanting area 3b of paste removing member 3 is made preferably the same as or more than the length of the squeegee's complementary angle side and is 15 mm in the present exemplary embodiment since a flat squeegee of 9 mm thick is used.

When the length of slanting area 3b is made less than the thickness of the foregoing flat squeegee, some paste not yet removed remains on the upper part of the squeegee at the non-printing side thereof and it can be imagined easily that this residual paste also may fall from the squeegee. Paste removing member 3 can be fixed on mask 2 by an adhesive (not shown in the drawings) or fixed mechanically on mask 2 by a bracket and the like (not shown in the drawings).

The gaps between paste removing member 3 and plate framework 1 or mask 2 are sealed with a resin and the like, thereby allowing the paste to be prevented from entering into the gaps.

A description is given to a method for filling conductive paste 24 by the use of plate for printing 10 for the foregoing sealing with reference to FIG. 3(a) to FIG. 3(g).

Conductive paste 24 of above uses copper powder with an average particle size of 2 $\mu$m in diameter. As the resin is used a thermosetting epoxy resin (no solvent type) and as the hardening agent is used an amine base hardening agent. A mixture formed of 85 wt % of the copper powder, 12.5 wt % of the resin and 2.5 wt % of the hardening agent is well kneaded by the use of three rolls to obtain conductive paste 24. When the viscosity of conductive paste 24 is measured, paste 24 shows dilatancy, i.e., the property of increasing viscosity as the rotational speed of the object to be tested is increased. The viscosity of conductive paste 24 before use measures about 100 Pa·s at a rotational speed of 0.5 rpm when an E type viscometer is used.

Figure 3:
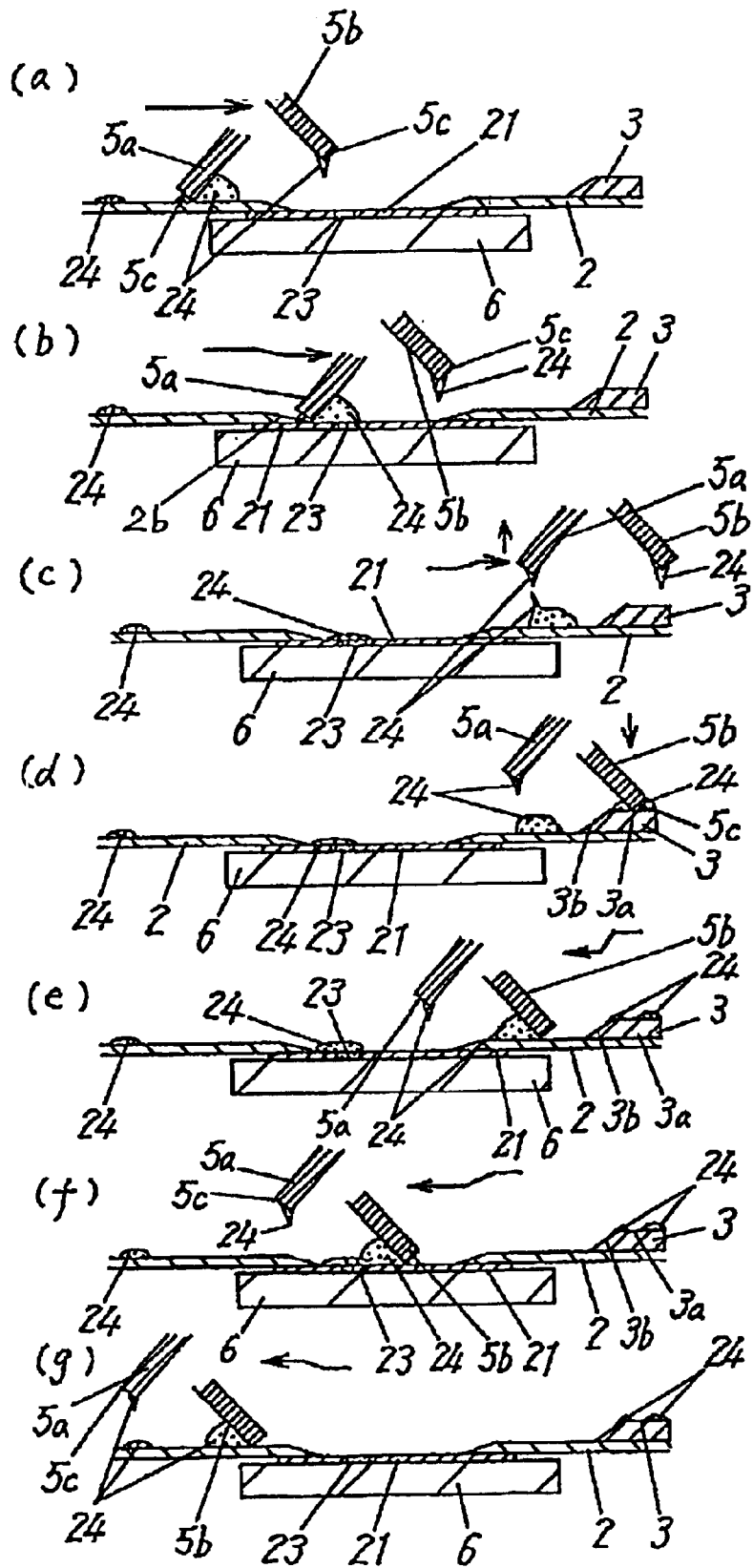
FIG. 3 shows cross-sectional views of the paste fling steps performed according to a squeegeeing method of the present invention.
Figure 4:
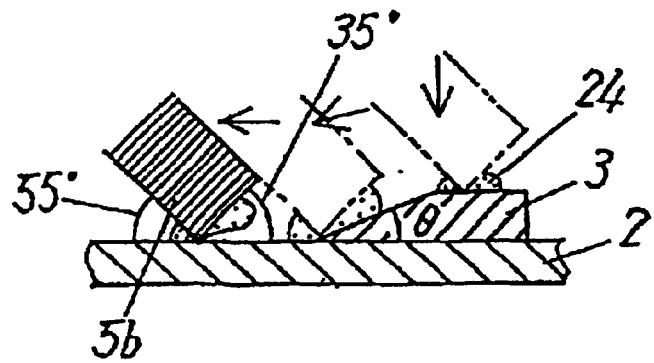
FIG. 4 shows cross-sectional views of a paste removing member of the present invention to examine how a slanting angle of the paste removing member affects the effectiveness thereof
Figure 4:
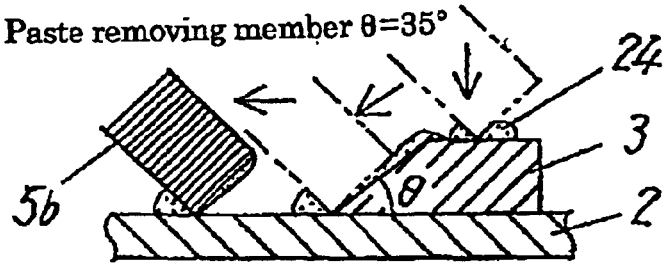
Figure 4:
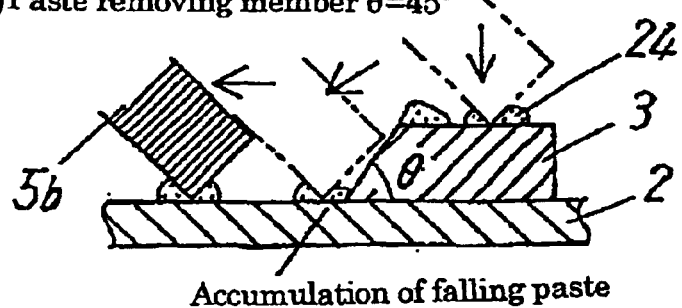
Figure 4:
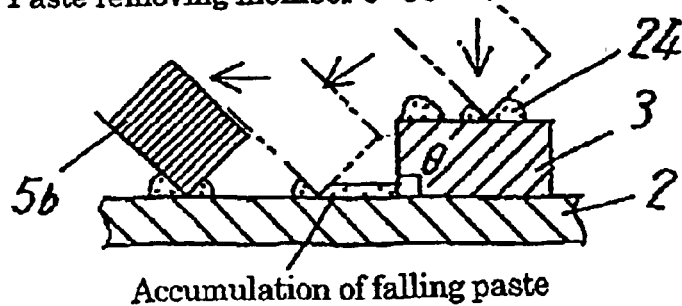

Filling of conductive paste 24 is performed as follows:

First, as FIG. 3(a) shows, mask 2 is placed on prereg sheet 21 disposed on stage 6 of a printing machine (not shown in the drawings), prereg sheet 21 having a mask film attached by adhesion on both surfaces thereof, respectively, and having through hole 23 formed therein, and stage 6 having a function of mounting things thereon by suction. Then, out of moving forth squeegee 5a and moving back squeegee 5b that are located above, movable vertically as well as horizontally and/or can be applied with a pressing force and have a printing angle of 55°, respectively, only moving forth squeegee 5a is descended to a predetermined position on mask 2 and moved forward at a speed of 50 mm/s with conductive paste 24 being rolled out by applying a pressing force of 0.1 MPa. The source of the pressing force applied to the squeegee is air.

Moving forth squeegee 5a passes over slanting area 2b of mask 2 and reaches the surface of prereg sheet 21 as FIG. 3(b) shows. Since squeegees 5a and 5b are provided with the ability to move up or down freely in accordance with the respective positions while maintaining the pressing force applied thereto, the pressing force applied to the respective squeegees 5a and 5b is kept at a constant value wherever the squeegees 5a and 5b pass, over mask 2 or prereg sheet 21.

When moving forth squeegee 5a stops at a predetermined position on mask 2 after travelling on prereg sheet 21 and another slanting area 2b, moving forth squeegee 5a is moved upward, letting conductive paste 24 fall freely on mask 2 as FIG. 3(c) shows and then, as FIG. 3(d) shows, only moving back squeegee 5b is moved downward to rest on flat area 3a of paste removing member 3.

Next, as FIG. 3(e) shows, moving back squeegee 5b is moved downward while sliding along the surface of slanting area 3b of paste removing member 3, thereby removing conductive paste 24 in non-printing side 5c (complementary angle side) of moving back squeegee 5b.

After conductive paste 24 is removed from squeegee's non-printing side 5c (complementary angle side), moving back squeegee 5b is moved on the surfaces of mask 2 and prereg sheet 21 at a speed of 50 mm/s in the same way as moving forth squeegee 5a as FIG. 3(f) and FIG. 3(g) show, thereby filling conductive paste 24 in through hole 23.

In the present exemplary embodiment, paste removing member 3 is provided to the side of moving back squeegee 5b only and whatever produced by conductive paste 24 that fills from moving forth squeegee 5a is allowed to be removed during a finishing cycle performed by moving back squeegee 5b, thereby solving the aforementioned problem. When an adverse effect caused by falling of conductive paste 24 from both moving forth squeegee 5a and moving back squeegee 5b is to be prevented, paste removing member 3 should be put in place on each of both sides of mask 2.

Next, how the ability of paste removing member 3 to get rid of paste varies according to a slanting angle of the slanting area is examined.

Each respective squeegee used in the tests for above has such properties as a flat type of 9 mm thick, a hardness of 70, a filling angle of 55° (a complementary angle of 35°, a pressing force for filling of 0.1 MPa and a filing speed of 50 mm/s. The slanting angles employed are 15°, 35°, 45° and 90°. The test results are as shown in Table 1 and FIG. 4.

When the slanting angle is 15°, the difference between the slanting angle of slanting area 3b and the complementary angle (35°) of moving back squeegee 5b is large, resulting in creating a gap. Therefore, even after moving back squeegee 5b passes slanting area 3b, conductive paste 24 in complementary angle side 5c is not allowed to be removed and the problem of falling of conductive paste 24 on prereg sheet 21 is not solved.

TABLE 1

| Slanting Angle of Paste Removing Member | Falling of Paste on Board Surface | Scraping of Paste at Complementary Angle Side of Squeegee |
|---|---|---|
| 15° | X | X |
| 35° | ○ | ○ |
| 45° | Δ | ○ |
| 60° | Δ | ○ |
| 90° | Δ | ○ |

When the slanting angle is 35°, the slanting angle of slanting area 3b and the complementary angle (35°) of moving back squeegee 5b become the same, resulting in creating no gaps with the complementary angle side of moving back squeegee 5b when the squeegee passes slanting area 3b. Therefore, after moving back squeegee 5b passes slanting area 3b, conductive paste 24 is found to have been removed from mask 2. In practice, however, moving back squeegee 5b is a little bit deformed due to the printing pressing force applied thereto, thereby causing the actual complementary angle of moving back squeegee 5b to exceed 35° with resulting creation of a small gap. In spite of that, most of conductive paste 24 is removed at slanting area 3b to allow no conductive paste 24 to fall on prereeg sheet 21. After repeating this test 1000 times, it is confirmed that the falling of conductive paste 24 on prereg sheet 21 has not occurred at all When the slanting angle is 45°, the difference between the slanting angle of slanting area 3b and the complementary angle (35°) of moving back squeegee 5b becomes large but the edge of slanting area 3b is brought into contact with complementary angle side 5c of moving back squeegee 5b, thereby allowing conductive paste 24 at the complementary angle side of moving back squeegee 5b to be removed.

However, since the edge of moving back squeegee 5b at the conductive paste filling side passes slanting area 3b with the edge floating from the surface of slanting area 3b, conductive paste 24 falls in the gap between moving back squeegee 5b and paste removing member 3, thereby forming an accumulation of conductive paste 24 at the time when moving back squeegee 5b gets to mask 2 as FIG. 4(c) shows.

As the number of printing times increases, the accumulation of conductive paste 24 becomes larger, thereby allowing sometimes conductive paste 24 to fall repeatedly on prereg sheet 21, failing in solving the problem of falling of conductive paste 24 on prereg sheet 21 completely. However, the frequency of falling of conductive paste 24 on prereg sheet 21 is reduced in comparison with the case where the slanting angle is 15°.

When the slanting angle is 90°, the difference between the slanting angle of slanting area 3b and the complementary angle (35°) of moving back squeegee 5b becomes still larger than the case where the slanting angle is 45°. However, the edge of slanting area 3b is brought into contact with complementary angle side 5c of moving back squeegee 5b, thereby allowing conductive paste 24 at complementary angle side 5c of moving back squeegee 5b to be removed.

However, as in the case where the slanting angle is 45°, conductive paste 24 falls in the gap between the squeegee and paste removing member 3 to add to the accumulation of conductive paste 24 as FIG. 4(d) shows and, as the number of paste filling times increases, the volume of the accumulation of conductive paste 24 is increased, thereby causing sometimes conductive paste 24 to fall on prereg sheet 21 although the frequency of falling of conductive paste 2 is decreased in comparison with the case where the slanting angle is 15°. Thus, the problem of falling of conductive paste 24 on prereg sheet 21 is not solved completely.

From the study conducted in above, it is confirmed that a more effective removal of conductive paste 24 is allowed to be realized by determining the slanting angle of paste removing member 3 to be near the complementary angle of the squeegee.

In addition, even when the same conductive paste filling angle is applied, the complementary angle of the squeegee changes. It is preferred that the slanting angle of paste removing member 3 is set to near the complementary angle of the squeegee at the time when conductive paste 24 is actually filled because the squeegee is deformed to some extent according to the hardness of rubber, length and thickness of the squeegee, the pressure applied to conductive paste 24 and the like.

Although a dilatant paste is employed in the present exemplary embodiment, the phenomenon of conductive paste 24 to extend to the squeegee's complementary angle side is the same even when a Newtonian paste is employed. Therefore, it is needless to say that the same benefits as above are allowed to be gained with the Newtonian paste.

In the present exemplary embodiment, a description is primarily given to the case where conductive paste 24 is filled but it is needless to say that conductive paste 24 in the squeegee's non-printing side (the complementary angle side) is allowed to be removed even in the case where conductive paste 24 is used in pattern printing.

Further, in the present exemplary embodiment, although a copper paste is used as conductive paste 24, such pastes as a paste mainly formed of silver, gold and a powder of an alloy of silver and gold or solder and a paste mainly formed of a high polymer material are allowed to be equally well used and, as long as such pastes are of the type that extends to the squeegee's complementary angle side at the time of paste filling or paste printing, it is easily assumed that the paste removing method of the present invention can be used effectively.

(Second Exemplary Embodiment)

Figure 5:
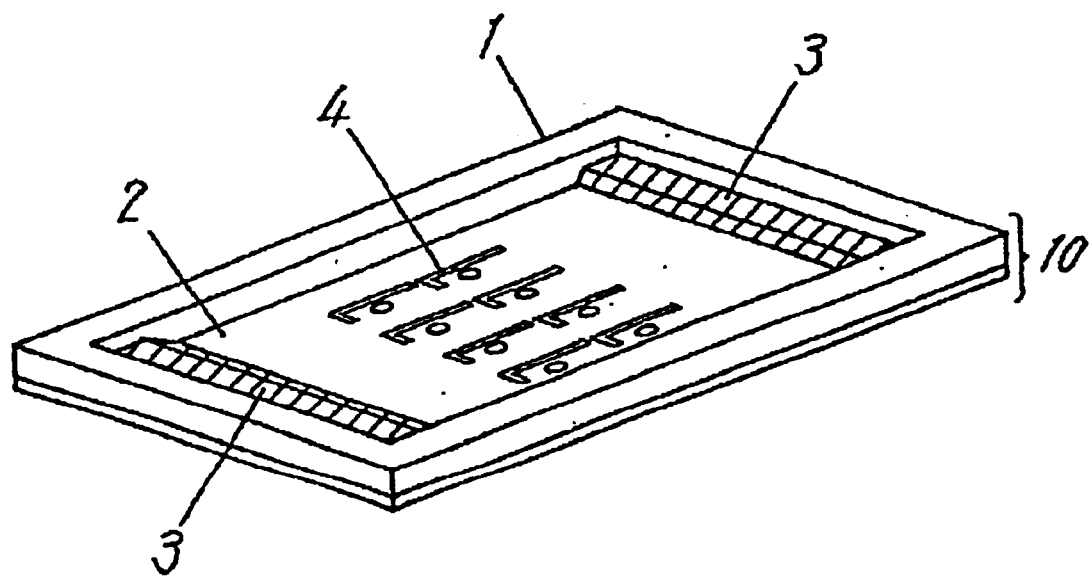
FIG. 5 is a perspective view of a second plate for printing of the present invention.
Figure 6:
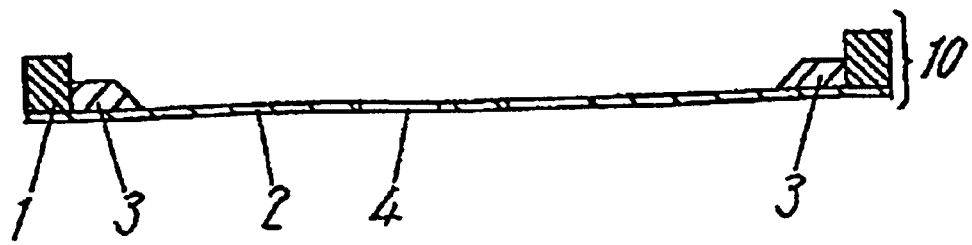
FIG. 6 is a cross-sectional view of the second plate for printing of the present invention.
Figure 7:
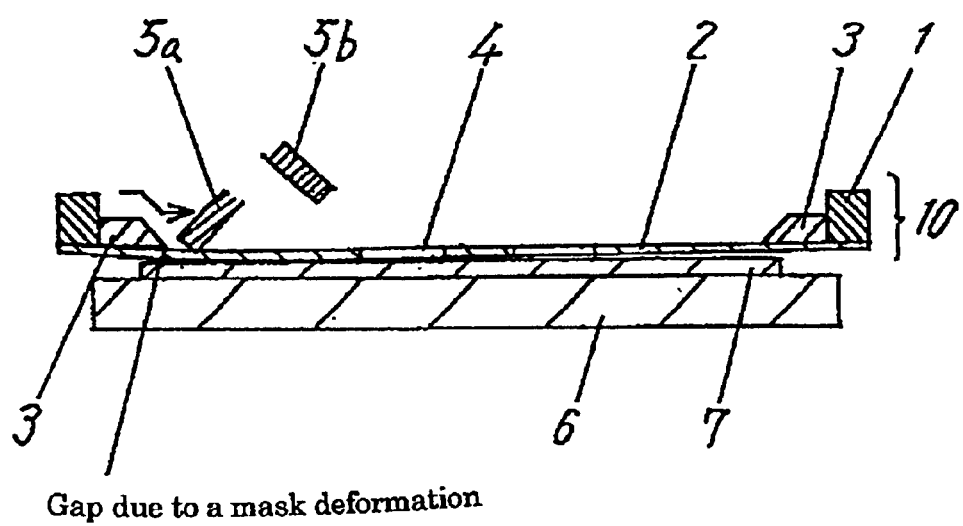
FIG. 7 is a cross-sectional view of a paste removing member and the vicinity thereof to describe what is happening there when paste printing is performed by the use of the second plate for printing of the present invention.
Figure 8:
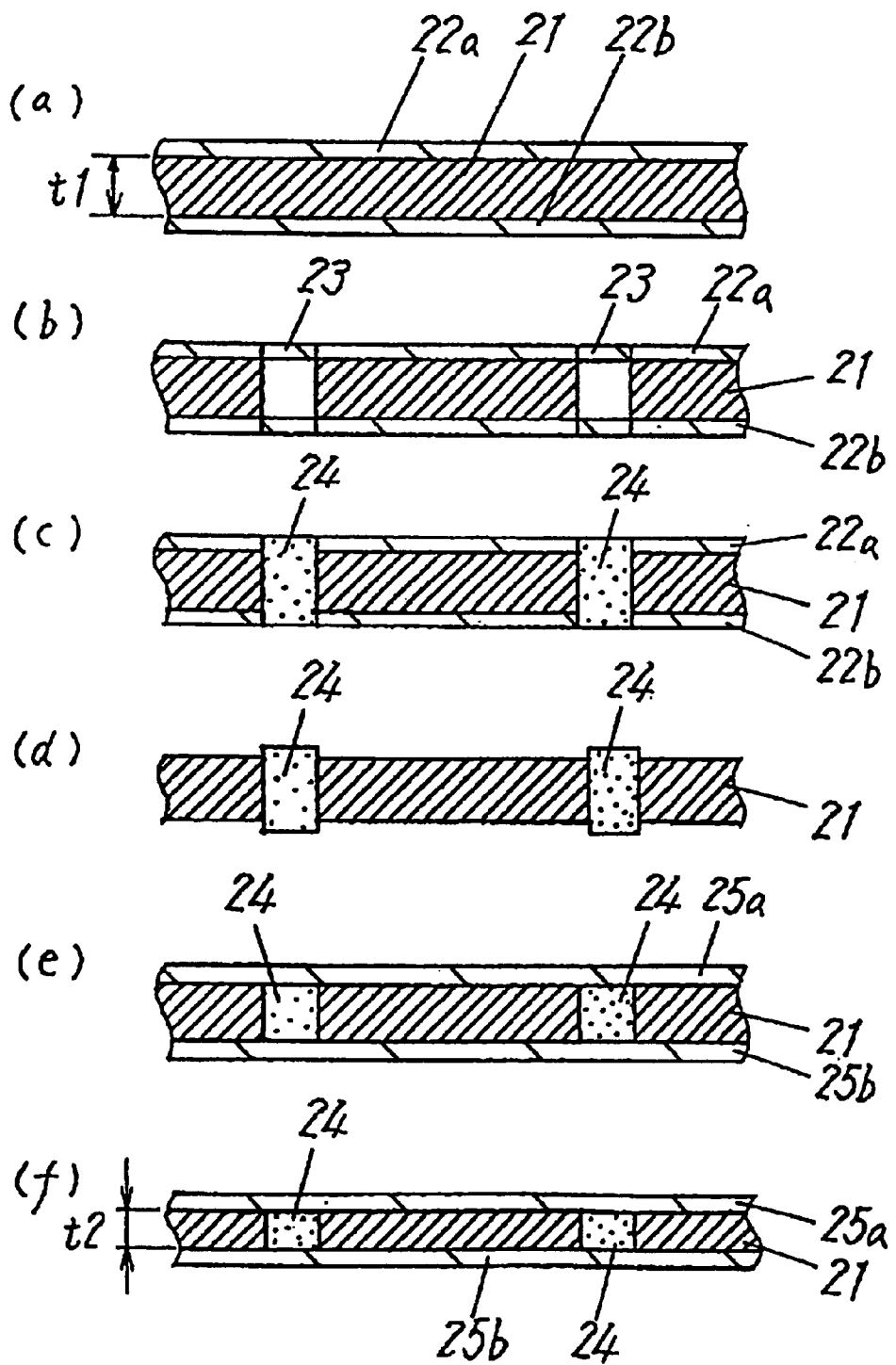
FIG. 8 shows cross-sectional views of the production steps performed according to a conventional manufacturing method of two-sided circuit boards.
Figure 9:
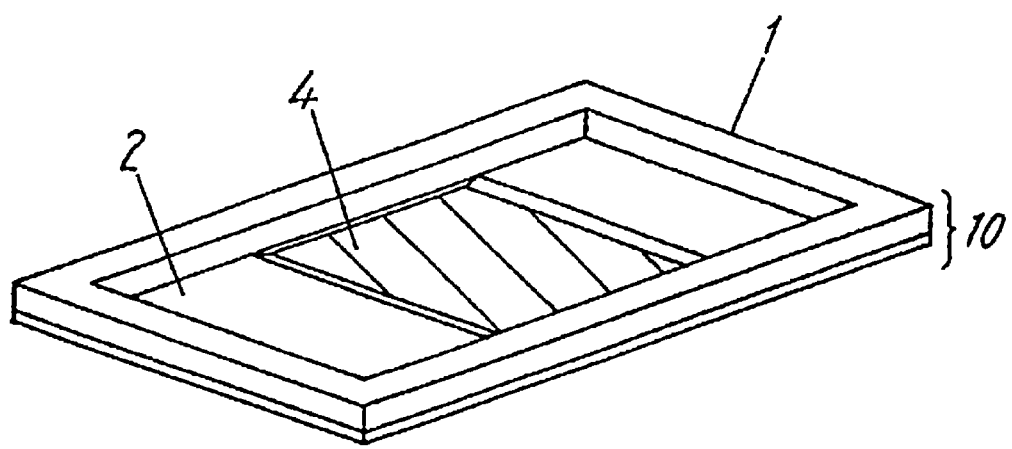
FIG. 9 is a perspective view of a typical conventional plate framework mounted with a mask having an opening.
Figure 10:
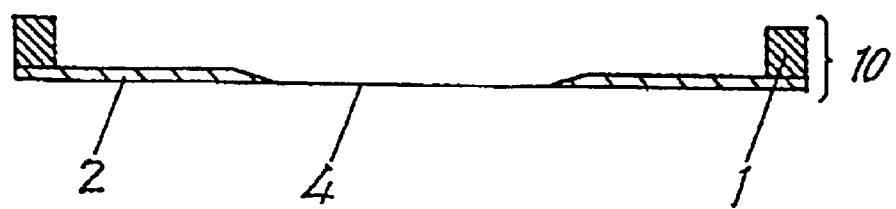
FIG. 10 is a cross-sectional view of the typical conventional plate framework of FIG. 9.
Figure 11:
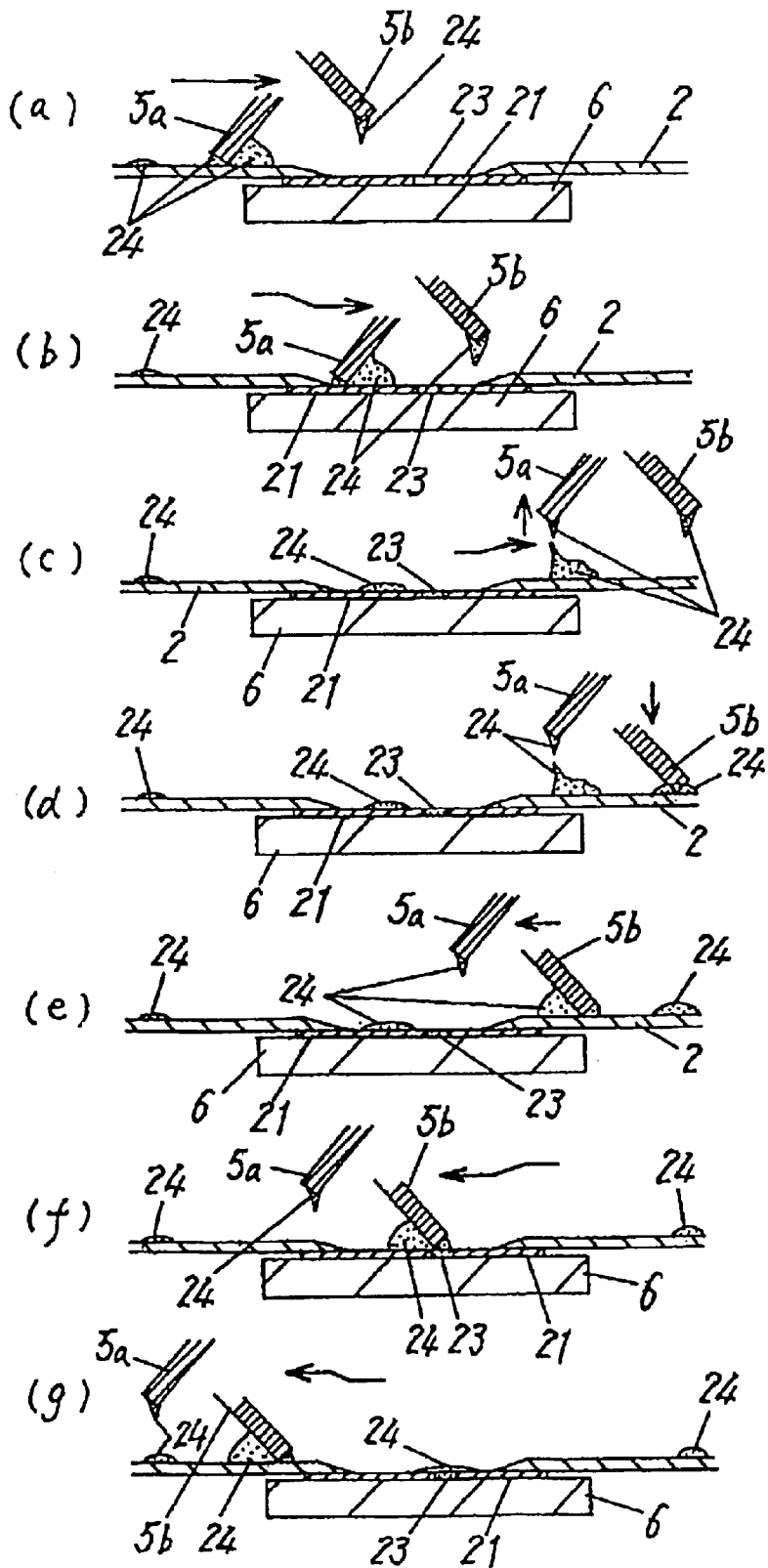
FIG. 11 shows cross-sectional views of the paste filling steps performed according to a conventional squeegeeing method.

FIG. 5 is a perspective view of a second plate for printing of the present invention. FIG. 6 is a cross-sectional view of the second plate for printing of the present invention. FIG. 7 is a cross-sectional view of a paste removing member and the vicinity thereof to describe what is happening there when paste printing is performed by the use of the second plate for printing of the present invention.

In FIG. 5 and FIG. 6, the reference numeral 10 is a plate for printing of the present invention and plate for printing 10 comprises a plate framework 1 made of a metal such as aluminum and the like and an about 100 μm thick mask 2, which is made of stainless steel and mounted on the plate framework 1. There is provided opening 4 for patterning at a predetermined position of mask 2. Further, there is provided a paste removing member 3, which is made of stainless steel, formed of a flat area and a slanting area and mounted on the plate framework 1 by means of a screw on both ends thereof located in the squeegee's moving direction, respectively. The surfaces of paste removing member 3 realize a high degree of smoothness by buffing and the like. In this case, plate framework 1 and paste removing member 3 are formed of a material different from each other, respectively, and both are put together by the use of a screw. The foregoing plate framework 1 and paste removing member 3 are also allowed to be made of the same material and formed into a one-piece structure according to such methods as an aluminum die-casting method and the like.

Even when plate framework 1 and paste removing member 3 are made into a one-piece structure, at least the squeegee's extent of wear is allowed to remain at the same level as the level at the time when mask 2 is in use by achieving the same or higher level of smoothness and the same or lower level of friction coefficient as those of mask 2 for the surface of paste removing member 3. A description is given to what is happening near paste removing member 3 with reference to part of the paste printing process performed by the use of plate for printing 10 of the present exemplary embodiment with reference to FIG. 7. In FIG. 7, the reference numeral 6 is a stage of a printing machine (not shown in FIG. 7), the stage having a function of fixing board 7 by sucking. Mask 2 is fixed onto plate framework 1 only, thereby allowing paste removing member 3 to remain free from mask 2. After board 7 is placed on stage 6, plate for printing 10 is set. At this time, according to the general method of printing, there is provided a narrow gap between board 7 and mask 2 so as to have a paste transferred onto the surface of board 7 by passing through openings 4 of mask 2 upon starting the printing process.

When the printing process is performed by the use of plate for printing 10 of the present exemplary embodiment under the foregoing condition, the paste on the complementary angle side of moving forth squeegee 5*a* is removed by paste removing member 3 and moving forth squeegee 5*a* reaches mask 2. At this time, mask 2 is deformed downward because of the pressing force applied by moving forth squeegee 5*a* and the extent of the downward deformation is equal to the gap between mask 2 and board 7. In this respect, the paste printing as described in above is the same as the ordinary method of printing.

By the time when moving forth squeegee 5*a* reaches mask 2, the paste on the squeegee's complementary angle side is removed, thereby eliminating the incidence of paste falling even if the printing process is performed in the same way as the ordinary printing process. However, there is no paste removal effect at all even when squeegees 5*a* and 5*b* are made to pass along the surface of slanting area 3*b* of paste removing member 3 by ascending, just ending up with taxing on the printing machine and squeegees 5*a* and 5*b*. Therefore, in principle, such consideration is necessary as making squeegees 5*a* and 5*b* pass along the surface of slanting area 3*b* downward only and the like. Here, a description is given to the case where the paste printing process is performed by moving forth squeegee 5*a* but the description is applicable equally well to the case where moving back squeegee 5*b* is used in the paste printing process.

As described in above, by having a paste removing member mounted directly on a plate framework, the plate for printing of the present exemplary embodiment allows a paste on the non-printing side of a squeegee to be removed in the same manner as the plate for printing in the first exemplary embodiment of the present invention and also the paste removing member is no longer needed to be mounted and dismounted every time a mask is exchanged, thereby allowing the plate for printing of the present exemplary embodiment to be used also as a plate for printing 10 for general screen printing that requires a mask deformation.

In addition, although a mask is not fixed onto the paste removing member mounted on the plate framework and remains free therefrom, it is needless to say that the same effects are expected even if the mask is fixed onto the paste removing member by an adhesive and the like as long as the plate for printing is allowed to maintain a spacing whereby absorption of a mask deformation is made possible.

Although stainless steel is used as the mask material in the foregoing, it is possible to assume easily that the same effects can also be expected by using such high polymer materials as polytetrafluoroethylene (i.e., "TEFLON"), nylon and the like as the mask material.

INDUSTRIAL APPLICABILITY

As described in above, a plate for printing and a printing method of the present invention feature that a paste on the non-printing side (the complementary angle side) of a squeegee is removed before pattern printing or paste filling is performed, thereby allowing the paste on the squeegee to be prevented from falling down and consequently allowing a benefit of producing circuit boards excelling in quality to be realized.

What is claimed is:

1. A plate for printing comprising:
   a mask with an opening area and a non-opening area;
   a plate framework with at least four sides, on which said mask is fixed; and
   a paste removing protrusion extending from a surface of said plate, wherein said paste removing protrusion is arranged on said plate such that a squeegee contacts said paste removing protrusion before contacting said mask when commencing a printing step;
   wherein said paste removing protrusion is so structured as to have a flat area and a slanting area: and
   wherein said paste removing protrusion is disposed only on said mask's non-opening area.

2. The plate for printing according to claim 1, wherein said paste removing protrusion is disposed on a printing start side or on a side opposite to said printing start side thereof.

3. The plate for printing according to claim 1, wherein said paste removing protrusion is disposed on a printing start side and a side opposite to said printing start side, respectively.

4. The plate for printing according to claim 1, wherein said paste removing protrusion is disposed on a side of said plate framework that is perpendicular to a squeegee's forward moving direction.

5. The plate for printing according to claim 1, wherein a degree of surface smoothness of said paste removing protrusion is equal to or higher than a degree of surface smoothness of said mask.

6. The plate for printing according to claim 1, wherein a coefficient of friction of said paste removing protrusion is equal to or smaller than that of said mask.

7. A printing device having a squeegee couplable to the plate for printing according to claim 1, wherein a length of said slanting area is made same as or longer than the squeegee's thickness.

8. A plate for printing comprising:
   a mask with an opening area and a non-opening area;
   a plate framework with at least four sides, on which said mask is fixed; and
   a paste removing protrusion extending from a surface of said plate, wherein said paste removing protrusion is disposed on a side of said plate framework that is perpendicular to a squeegee's forward moving direction,
   wherein said paste removing protrusion is formed in a one-piece structure with a side of said plate framework.

9. A plate for printing comprising:
   a mask with an opening area and a non-opening area;
   a plate framework with at least four sides, on which said mask is fixed; and a paste removing protrusion extending from a surface of said plate, wherein said paste removing protrusion is disposed on a side of said plate framework that is perpendicular to a squeegee's forward moving direction, wherein a spacing between said paste removing protrusion and said side of said plate framework is sealed with resin.

10. A printing device having a squeegee couplable to a plate for printing, said plate comprising: a mask with an opening area and a non-opening area; a plate framework with at least four sides, on which said mask is fixed; and a paste removing protrusion extending from a surface of said plate, wherein said paste removing protrusion includes a slanting area such that a slanting angle of said slanting area is made almost same as an angle complementary to the squeegee's printing angle.

11. A plate for printing comprising:
   a mask with an opening area and a non-opening area;
   a plate framework with four sides, on which said mask is fixed; and
   a paste removing member formed of a flat area and a slanting area, both together constituting a side of said plate framework that is perpendicular to a squeegee's moving forward direction, wherein said paste removing member is arranged on said plate such that a squeegee contacts said paste removing member before contacting said mask when commencing a printing step;
   wherein said paste removing protrusion is so structured as to have a flat area and a slanting area; and
   wherein said paste removing protrusion is disposed only on said mask's non-opening area.

12. A method of printing a paste on an object to be printed with said paste by means of a plate comprising: a mask with an opening area and a non-opening area; a plate framework with at least four sides, on which said mask is fixed; and a paste removing member, said method comprising a step of removing a paste located at a squeegee's non-printing side by means of said paste removing member before printing is started.

13. The method of printing a paste according to claim 12, wherein a squeegee is lowered in position, and is brought into contact with and slid on said paste removing member, respectively.

14. The method of printing according to claim 12, wherein said paste is Newtonean or dilatant.

15. The method of printing according to claim 1, wherein said object to be printed with said paste is prepared by laminating a mask film on both surfaces of a board, respectively, and also by forming a through hole therein; and said paste is filled in said through hole by said printing method.

16. The method of printing a paste according to claim 12, wherein said printing is performed by using a plate for printing that has said paste removing member at both a printing start side and a side opposite to said printing start side, respectively, and by means of two squeegees of moving forth and moving back.

17. The method of printing according to claim 12, wherein said paste is a metallic powder, a thermosetting resin and a curing agent and exclusive of a solvent.

18. The method of printing a paste according to claim 12, wherein said paste removing member includes a protrusion extending from a surface of said plate.

19. In combination, a plate and a printing device couplable to said plate, said printing device including a moving back squeegee and a moving forward squeegee, wherein said plate includes a paste removing protrusion extending from a surface of said plate disposed in such a way that at least the moving back squeegee of said printing device passes said paste removing protrusion when two squeegees of moving forth and moving back are used in printing a paste.

20. A plate for printing comprising:
   a mask with an opening area and a non-opening area;
   a plate framework with at least four sides, on which said mask is fixed; and
   a single paste removing protrusion disposed on a printing start side and fixed on the non-opening area of said mask;
   wherein said paste removing protrusion is so structured as to have a flat area and a slanting area; and
   wherein said paste removing protrusion is disposed only on said mask's non-opening area.

* * * * *